United States Patent [19]
Matsumura

[11] Patent Number: 4,563,741
[45] Date of Patent: Jan. 7, 1986

[54] ROTATIONAL ANGLE SIGNAL GENERATING SYSTEM FOR INTERNAL COMBUSTION ENGINES

[75] Inventor: Masami Matsumura, Hyogo, Japan

[73] Assignee: Mitsubishi Denki Kabushiki Kaisha, Tokyo, Japan

[21] Appl. No.: 380,598

[22] Filed: May 21, 1982

[30] Foreign Application Priority Data

May 25, 1981 [JP] Japan ............................ 56-76278[U]

[51] Int. Cl.4 ...................... G06F 15/46; G01P 3/489; H03K 5/00

[52] U.S. Cl. ................................ 364/431.12; 328/20; 364/701

[58] Field of Search ...................... 364/431.12, 431.06, 364/701; 328/20; 307/271; 123/480, 486

[56] References Cited

U.S. PATENT DOCUMENTS

| | | | |
|---|---|---|---|
| 3,161,816 | 12/1964 | Holcomb | 328/20 X |
| 3,770,327 | 11/1973 | Ruof | 328/20 X |
| 3,909,717 | 9/1975 | Gazzano | 328/20 X |
| 3,965,430 | 6/1976 | Brandt | 328/20 |
| 3,969,614 | 7/1976 | Moyer et al. | 364/431.06 |
| 4,193,380 | 3/1980 | Marchak et al. | 123/480 X |
| 4,204,256 | 5/1980 | Klötzner | 364/431.12 |
| 4,391,253 | 7/1983 | Ito | 123/480 |
| 4,477,875 | 10/1984 | Suzuki et al. | 364/431.06 |

OTHER PUBLICATIONS

Merson: Digital Multiplier RCA Technical Notes, RCA TN736, Jan. 1968.
Carfi et al: TTL-Compatible Frequency Doubler Rejects Harmonics Without Timed Circuits.
Electronic Design, vol. 28, No. 3, Feb. 1, 1980, p. 98.

*Primary Examiner*—Felix D. Gruber
*Attorney, Agent, or Firm*—Sughrue, Mion, Zinn, Macpeak & Seas

[57] ABSTRACT

A rotational angle signal generating system for an internal combustion engine produces its signal from the a.c. signal generated by a magneto-generator mounted in the ignition distributor of the engine.

2 Claims, 6 Drawing Figures

ROTATIONAL ANGLE SIGNAL GENERATING SYSTEM FOR INTERNAL COMBUSTION ENGINES

BACKGROUND OF THE INVENTION

The present invention relates to a rotational angle signal generating system for an internal combustion engine, which is to be used with a controller for controlling the fuel injection timing or the ignition timing of the engine in association with the r.p.m., the water temperature or the like thereof.

As a control means for the ignition system of an internal combustion engine of an automobile or the like, there has been used in recent years a method by which the running mode of the engine is detected by means of a variety of sensors so that the engine may be centrally controlled by a micro-computer in accordance with the detected signals.

As the data for discriminating the running mode of the engine, there may be listed the r.p.m., the crank angle, the manifold vacuum or the water temperature of the engine. As the sensors, on the other hand, there have been developed sensors used exclusively for detecting the above data. Of these sensors, there has been developed a crank angle detector for generating an engine rotational angle signal by combining a plurality of projections, which are formed at predetermined angular spacings on a rotary disc having a large diameter connected directly to a crankshaft, with a magnetic pickup.

Typical examples of such systems include the devices disclosed by U.S. Pat. Nos. 4,054,111 to Sand; 4,036,190 to Bigliani and 3,903,857 to Höning. In the Höning and Sand Patents, an element is secured to the crankshaft and is provided with angular indicia of various types detected by a sensor or sensors associated therewith. In Bigliani, a pair of pick-ups are used to detect a pair of indicia (teeth and a "protuberance") provided on the flywheel.

However, the existing rotational angle signal generating systems using such crank angle sensors and etc. have a defect in that they are difficult to adjust, and it is required to use a separate distributor for distributing a high voltage to the ignition plugs because the aforementioned crank angle sensor is mounted on the crankshaft.

SUMMARY OF THE INVENTION

The present device has been conceived to eliminate the aforementioned defect, and has an object of providing a rotational angle signal generating system for an internal combustion engine, which is made highly precise, while having its construction simplified and its adjustment facilitated, by producing the rotational angle signal of the internal combustion engine from the a.c. signal generated by a magneto-generator mounted in an ignition distributor.

BRIEF DESCRIPTION OF THE DRAWINGS

FIGS. 2(*a*)-2(*e*) illustrate the waveforms at the respective portions (*a*)-(*e*) of FIG. 1.

DETAILED DESCRIPTION OF THE PREFERRED EMBODIMENTS

Figure 1:
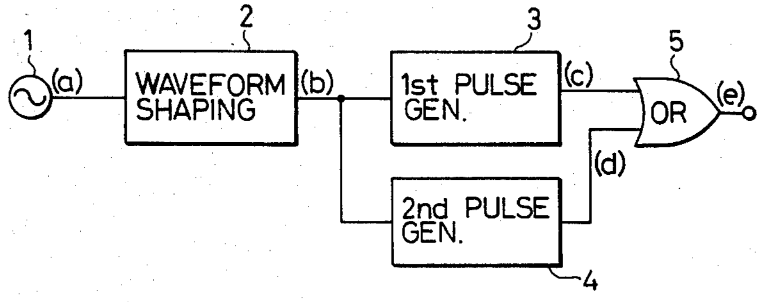
FIG. 1. is a block diagram showing one embodiment of the rotational angle signal gnerating system according to the present invention.
Figure 1:
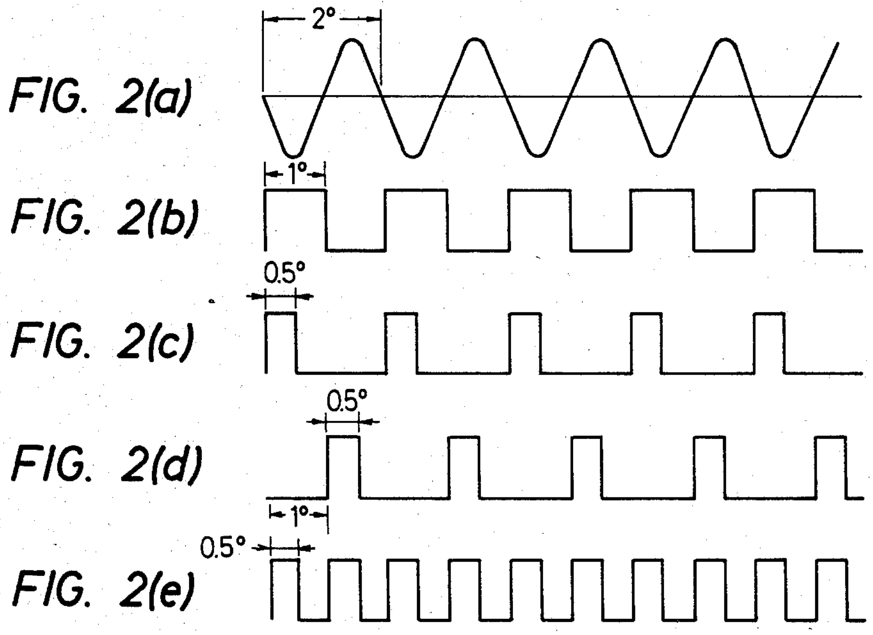

The present device will now be described with respect to one embodiment thereof, with respect to FIGS. 1 and 2. FIG. 1 is a block diagram showing one embodiment of a rotational angle signal generating system for an internal combustion engine according to the present invention. In FIG. 1, reference numeral 1 indicates a magneto-generator which is mounted in the ignition distributor (although not shown) of the engine for generating an a.c. signal corresponding to a predetermined rotational angle of the engine, i.e., a sinusoidal a.c. signal having its period corresponding to four degrees in terms of the rotational angle of the engine, or two degrees in terms of the rotational angle of the aforementioned ignition distributor. Numeral 2 indicates a waveform shaper for converting the output signal (i.e., the a.c. signal) of the magneto-generator 1 into square waves to thereby generate square waves having leading and trailing edges corresponding to the zero-crossing points of the aforementioned a.c. signal. Numeral 3 indicates a first pulse generator for generating pulses in synchronism with the leading edge of the squarewave output signal of the waveform shaper 2. Numeral 4 indicates a second pulse generator for generating pulses in synchronism with the trailing edge of the square-wave output signal of the waveform shaper 2. Numeral 5 indicates a logical sum circuit for logically adding the respective output signals of the first and second pulse generators 3 and 4.

FIGS. 2(*a*) to 2(*e*) are diagrams showing the waveforms of the signal appearing at respective positions (*a*)-(*e*) illustrated in FIG. 1. The operation of the aforementioned system of the present device will now be described with reference to these figures. Firstly, when the engine revolves, the magneto-generator 1 generates a sinusoidal a.c. signal having one period corresponding to two degrees in terms of the rotational angle of the ignition distributor (not shown), as shown in FIG. 2(*a*). The output signal of the magneto-generator 1 is converted by the wave-form shaper 2 into square waves in a manner such that the square waves have their leading edges located at the zero-crossing point of the sinusoidal a.c. signal from positive to negative, and their trailing edges located at the negative to positive crossing point. The output of the waveform shaper 2 is shown in FIG. 2(*b*). As a result, the square waves constitute a signal having "H" and "L" levels corresponding to one degree of the rotational angle, and a period corresponding to two degrees thereof.

The square-wave output signal of the waveform shaper 2 is fed to the first and second pulse generators 3 and 4. The first pulse generator 3 generates first pulses, which are in synchronism with the leading edges of the aforementioned square-wave output signal, i.e., fixed angle pulses which have, in this case, their "H" level width (i.e., the pulse width) corresponding to 0.5 degrees in terms of the rotational angle, as shown in FIG. 2(*c*). On the other hand, the second pulse generator 4 generates second pulses, which are in synchronism with the trailing edges of the aforementioned square-wave output signal, i.e., fixed angle pulses which again have, in this case, a pulse width corresponding to 0.5 degrees in terms of the rotational angle, as shown in FIG. 2(*d*).

The respective output signals of the first and second pulse generators 3 and 4, i.e., the first and second pulses, are fed to the logical sum circuit 5, in which they are added. From the logical sum circuit 5, there is thus generated a pulse signal constituting the rotational angle signal of the internal combustion engine, i.e., a pulse train which has "H" and "L" level widths each corresponding to 0.5 degrees in terms of the rotational angle, and a period corresponding to one degree thereof, as shown in FIG. 2(*e*).

As has been described hereinbefore, according to the present device, the rotational angle signal of the internal combustion engine is generated from an a.c. signal, which is in turn generated by the magneto-generator mounted in the ignition distributor of the internal combustion engine, so that the construction and the adjustment thereof can be simplified.

As will be understood from the foregoing embodiment, according to the present device, the rotational angle signal having a period corresponding to one degree of the rotational angle and a pulse width corresponding to 0.5 degrees of this angle, is generated by shaping the waveform of the output signal of a magneto-generator operating to generate a sinusoidal a.c. signal having a period corresponding to four degrees of the rotational angle of the engine, i.e., two degrees of the rotational angle of the ignition distributor, and by subsequently logically summing two series of pulses which are in synchronism with the leading and trailing edges of the square-wave output signal obtained, respectively, and which have a pulse width corresponding to 0.5 degrees of the rotational angle. As a result, even in the case where it is difficult to highly precisely machine the diameter of, for example, the magneto-generator mounted in the aforementioned disbritutor, there can be attained an advantage that it is possible to generate a highly precise rotational angle signal having a pulse width corresponding to 0.5 degrees of the distribution rotational angle.

What is claimed is:

1. A rotational angle signal generating system for an internal combustion engine, comprising; a magneto-generator mounted in an ignition distributor, said magneto-generator comprising an a.c. generator for generating an a.c. signal having a period corresponding to two degrees of the rotational angle of said ignition distributor; a waveform shaper for converting the output signal of said magneto-generator into square waves; a first pulse generator generating first pulses in synchronism with the leading edges of said square-wave output signal of said waveform shaper; a second pulse generator for generating second pulses in synchronism with the trailing edges of said square-wave output signal of said waveform shaper; and logical circuit means for logically summing said first and second pulses, each of said first and second pulse generators comprising fixed-angle pulse generators for generating pulses having a pulse width corresponding to 0.5 degrees of the rotational angle of said ignition distributor.

2. A rotational angle signal generating system as claimed in claim 1, said logical circuit means comprising an OR circuit.

* * * * *